United States Patent [19]

Kravitz et al.

[11] 4,001,867
[45] Jan. 4, 1977

[54] SEMICONDUCTIVE DEVICES WITH INTEGRATED CIRCUIT SWITCHES

[75] Inventors: Bernard L. Kravitz, Forest Hills; George R. Seaton, Northport, both of N.Y.

[73] Assignee: Dionics, Incorporated, Westbury, N.Y.

[22] Filed: Sept. 23, 1975

[21] Appl. No.: 616,040

Related U.S. Application Data

[63] Continuation-in-part of Ser. No. 499,534, Aug. 22, 1974, Pat. No. 3,918,083.

[52] U.S. Cl. .................. 357/39; 357/35; 357/46; 357/40; 357/30; 357/36; 307/299 A; 307/252 UA
[51] Int. Cl.² ............................. H01L 29/747
[58] Field of Search ............ 357/39, 35, 46, 40, 357/49, 30, 36; 307/299 A, 252 UA

[56] References Cited
UNITED STATES PATENTS

| | | | |
|---|---|---|---|
| 3,123,750 | 3/1964 | Hutson | 317/235 |
| 3,275,846 | 9/1966 | Baily | 307/88.5 |
| 3,475,666 | 10/1969 | Hutson | 317/235 |
| 3,535,615 | 10/1970 | Howell et al. | 323/22 |
| 3,564,291 | 2/1971 | Aagaard | 307/252 |
| 3,586,928 | 6/1971 | Bergman | 317/235 R |
| 3,684,902 | 8/1972 | Guiliano | 307/303 |
| 3,719,863 | 3/1973 | Ogawa | 317/235 R |
| 3,816,763 | 6/1974 | Korn | 307/252 UA |
| 3,893,153 | 7/1975 | Page | 357/38 |
| 3,918,083 | 11/1975 | Kravitz | 357/39 |

Primary Examiner—Martin H. Edlow
Attorney, Agent, or Firm—James J. Burke, II

[57] ABSTRACT

A bilateral, switching integrated circuit is described in U.S. Pat. No. 3,918,083. The present application discloses variations of the basic structure and devices incorporating both the basic structure and the variants. Included are a photosensitive, zero-crossing optoisolator, relay structures, a switch of greatly increased light sensitivity employing photodarlingtons, and a dielectrically isolated switch that can be triggered by light or gated injection currents.

17 Claims, 10 Drawing Figures

SEMICONDUCTIVE DEVICES WITH INTEGRATED CIRCUIT SWITCHES

RELATED APPLICATIONS

This application is a continuation-in-part of U.S. application Ser. No. 499,534 filed Aug. 22, 1974, now U.S. Pat. No. 3,918,083 issued Nov. 4, 1975.

BACKGROUND OF THE INVENTION

The above-noted patent discloses a planar, bilateral switching integrated circuit comprising four vertical NPN transistors sharing a common collector, with leads between the emitters and bases of adjacent pairs. The effective circuit, shown in FIG. 1 of the accompanying drawings, is a lateral triac comprising eight transistors, the NPN's noted above and four horizontal PNP's sharing a common base, in a transistor bridge construction.

Because all junctions reach a single surface, the device can be made photosensitive. In the basic configuration it is provided with a pair of gate terminals. When a gate current is applied between one of the gate terminals and an associated main terminal, or when a light-generated photocurrent reaches a certain magnitude, the device is triggered. Because of the symmetrical construction, AC circuits may be controlled, e.g. a single gate current can trigger the device in both quadrants I and III.

We call this new device a "photrac", since it is best described as a photosensitive triac, and as a symbol therefore we have adapted the well-known symbol for a silicon-controlled rectified (SCR), but with two gate terminals and arrows which indicate photosensitivity.

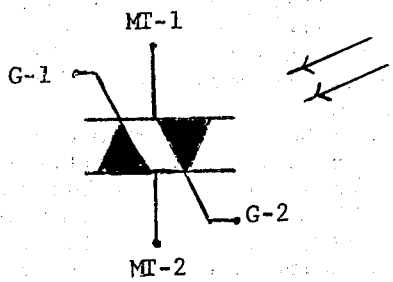

In FIG. 1, the NPN transistors are labelled Q1 through Q4, and the PNP's are Q5 through Q8. Light lines indicate internal interconnections inherent in the planar construction, and heavy lines indicate external leads. Either gate, when biased to its respective main terminal, can trigger conduction in quadrants I and III; this allows control from either or both sides of an AC line. The typical size of such a device is 25 mils square.

As also disclosed in the patent, it is preferred to diffuse the base in two stages. One stage is a normal base diffusion, and the other, which is through a larger mask so as to surround the first base, is two to four orders of magnitude lower in impurity concentration, and no higher than about $10^{16}$ atoms/cc. This improves voltage characteristics, raising breakdown voltage well above normal AC line voltages. The method of high voltage diffusion is described in U.S. Pat. No. 3,920,493 issued Nov. 18, 1975, and devices including same are disclosed in U.S. application Ser. No. 416,170 filed Nov. 15, 1973, both assigned to the same assignee as the instant application.

OBJECTS OF THE INVENTION

A general object of the present invention is to provide improved and specialized photracs.

One object of the present invention is to provide a dielectrically isolated (DI) photrac.

Another object of the present invention is to provide a photrac of greatly increased light sensitivity.

A further object of the present invention is to provide a zero-crossing photrac opto-isolator.

Yet another object of the present invention is to provide improved photrac relays.

Various other objects and advantages of the invention will become clear from the following description of embodiments thereof, and the novel features will be particularly pointed out in connection with the appended claims.

THE DRAWINGS

Reference will be made herein to the accompanying drawings, wherein:

FIG. 1 is a circuit diagram of the basic photrac;
FIG. 2 is a circuit diagram of a DI photrac;
FIG. 3 is a block diagram of a DI photrac;
FIG. 4 is a plan view of a DI photrac;
FIG. 5 is the circuit diagram of a photodarlington photrac;
FIG. 6 is a plan view of a photodarlington photrac;
FIG. 7 is a circuit diagram of a zero-crossing photrac opto-isolator;
FIG. 8 and FIG. 9 are circuit diagrams of two photrac relays; and
FIG. 10 is a circuit diagram illustrating photrac logic control devices.

DESCRIPTION OF EMBODIMENTS

1. DI photrac

The basic photrac circuit (FIG. 1) is necessarily a junction isolated device, through it will be appreciated that the whole device could be included in a dielectrically isolated circuit including other elements. In the basic circuit one gate can trigger the device in either quadrants I or III, because one transistor in each pair will block in either direction depending on its biasing. Its function in the blocking state, however, is essentially that of a diode. In its active state, of course, it functions as a transistor. A DI photrac can be constructed employing discrete, diodes replacing two of the integral transistors of the basic structure, the diodes functioning only as diodes, and attention is directed to FIGS. 2-4. A pair of transistors Q9, Q10 are constructed in common collector configuration, with diodes D1, D2 across their respective emitter and base terminals. The main terminals are connected to the respective emitters, and the device is gated at the respective bases. A lateral PNP transistor $Q_L$ is inherently part of the structure.

Figure 3:
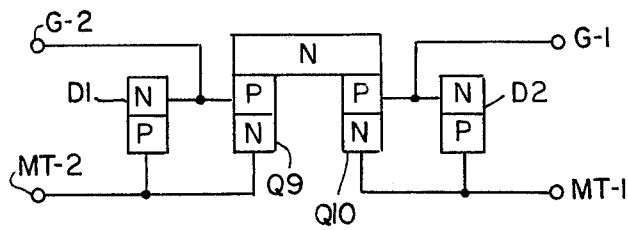

FIG. 3 is a block diagram showing respective conductivity types, but it will be appreciated that these may be reversed. Those skilled in the art will perceive that this device, in operation, will be similar to a pair of SCR's in the inverse-parallel or "back-to-back" mode.

More particularly a pair of back-to-back SCR's will include two vertical NPN transistors and two vertical PNP transistors. The DI photrac has two vertical NPN's, one lateral PNP and two external diodes. Triggering of two gates is required to control both quadrants I and III with both a DI photrac and back-to-back SCR's, and both devices can be photosensitive. However, in the structure of FIG. 4 discussed below, triggering can be carried out with one LED, whereas available back-to-back SCR's require two LED's. A simple and effective method of constructing this device is dielectric isolation (DI), and attention is directed to FIG. 4. A polycrystalline silicon matrix 10 has three "tubs" 12, 14, 16 of single crystal N-type silicon buried therein, each tub being entirely surrounded by a layer of silicon dioxide 18, which insulates it from the matrix. The techniques for producing such dielectrically isolated structures are well-known in the art and need not be detailed herein.

The bases of the transistors Q9, Q10 and the "P" sides of the diodes D1, D2 may be formed in a single diffusion of P-type impurities but, for high voltage capability, it is preferred that the bases be diffused in two stages as set forth in the patents noted hereinabove. A diffusion of N-type impurities is then carried out to form the emitter regions of the transistors. The lateral PNP transistor $Q_L$ is formed inherently.

The application of leads, following conventional evaporation and etching techniques, completes the device. More particularly, the emitter of transistor Q10 is connected across the P-side of diode D2 and to main terminal pad MT1. The base of transistor Q10 is connected across the opposite (N) side of D2 and to gate terminal G1.

Figure 4:
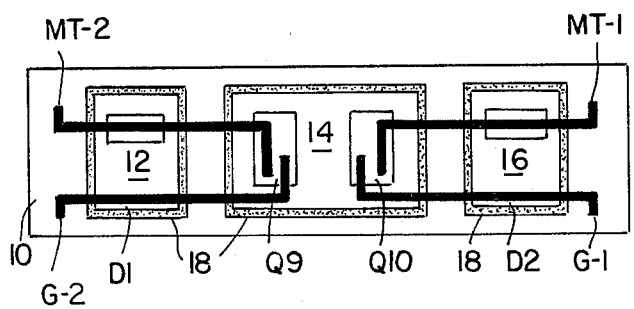

The operation of the device of FIG. 4 is identical to back-to-back, photosensitive SCR's. While this embodiment of the invention is most conveniently dielectrically isolated, it will be appreciated that a crude version of same could be constructed from discrete components, e.g. phototransistors and diodes. Alternatively, silicon or saphire (SOS), or air-isolated monolithic (AIM) techniques could be used.

The DI photrac is operationally distinct from the basic, junction isolated photrac, and it is structurally distinct from back-to-back SCR's. We thus feel that it should be represented by a distinct symbol, one that characterizes it as back-to-back SCR's having common parts, and have adopted the following:

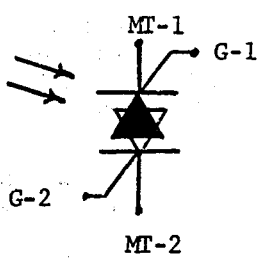

2. High-sensitivity photrac

Figure 1:
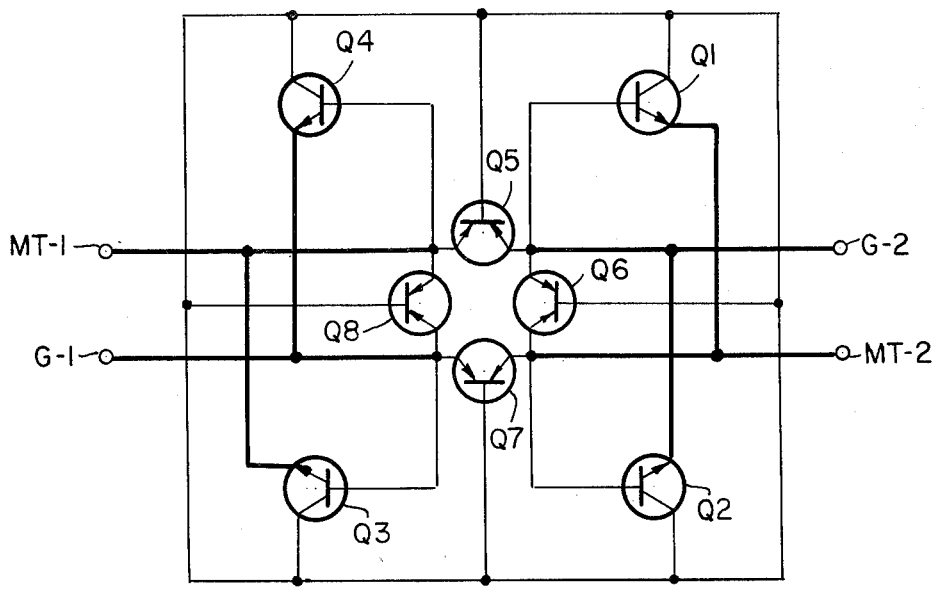
Figure 5:
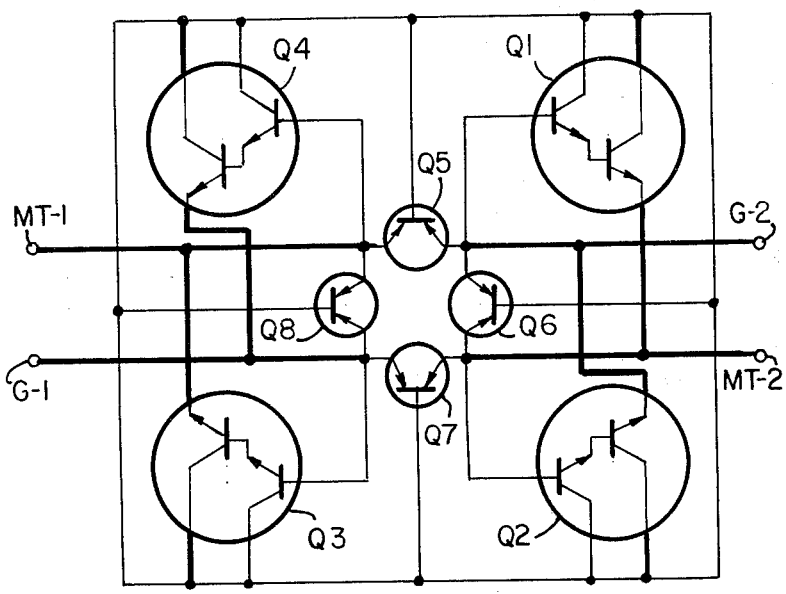

The construction and operation of Darlington amplifiers is well known; the basic structure as applied to the FIG. 1 circuit is illustrated in FIG. 5 for reference purposes. For simplicity, all of the inherent, lateral PNP transistors are not shown.

It is not unreasonable to assume that substitution of photodarlingtons for the NPN transistors Q1–Q4 in the basic photrac will greatly increase its light sensitivity or, expressed differently, greatly reduce the photon flux required to trigger the device. This is indeed the case. To operate a conventional photrac from a single light source, the maximum size of the photrac is limited, in that its light capturing area must be small enough to be covered by the single source. By using a photodarlington construction, with the input transistors centered on the chip, this limitation is removed, because the output transistors need not be photosensitive, and can be much larger than the spot of light generated by the source. Like other darlington devices, the darlington photrac will operate at low temperatures, since gain is temperature sensitive.

Figure 6:
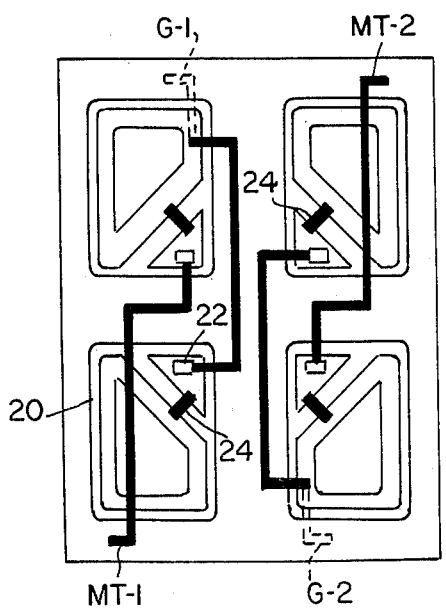

In essence, the device of FIG. 6 is constructed in the same manner as the basic photrac, but diffusions and masks are such that, each vertical NPN is replaced by a pair of NPN's 20, 22 sharing a common collector and having an external emitter-base interconnect 24. The lead structure is the same as the basic photrac, in that emitter-base connections are provided between adjacent pairs of photodarlingtons, but in the preferred embodiment of FIG. 6 the NPN's 22 are oriented to be as close to the center of the chip as possible, to facilitate triggering from a single source.

It will be appreciated that the photodarlington photrac can be made with the high voltage base diffusion described hereinabove. Those skilled in the art will also appreciate that the device has limitations: leakage current will increase with temperature, along with gain, etc.

3. Zero-crossing photrac

Figure 2:
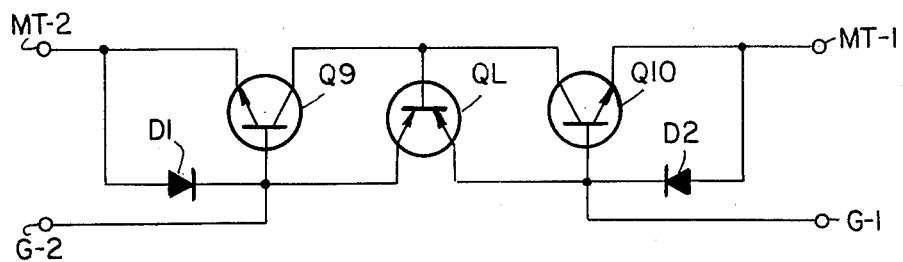
Figure 7:
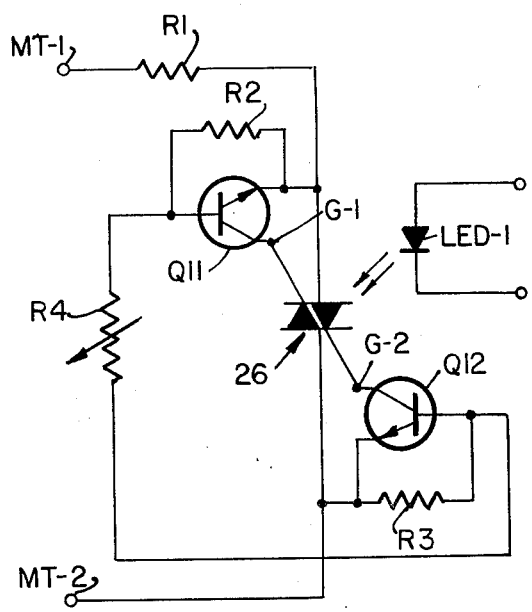

The zero-crossing photrac is, in essence, a basic photrac with controlled gate injection currents which, responsive to adjustment of an external variable resistor, allows it to carry out the zero-crossing function at any desired level. The dielectric isolation construction described hereinabove in connection with FIG. 2 is also well adapted for construction of the zero-crossing photrac. As in FIG. 2, three dielectrically isolated tubs of single crystal silicon are used. In this case, a conventional photrac (FIG. 1) occupies the central tub. The tubs on either side contain the control circuitry for each gate. The circuit is shown in FIG. 7, and attention is directed thereto.

As in conventional photrac power control applications, the main terminals MT1, MT2 of the photrac 26 are connected to a 120 volt AC line through a load R1. The control circuitry for each gate comprises a single transistor Q11, Q12 having a resistor R2, R3 across the emitter-base junction. The respective emitters are connected across the AC line, and the bases are connected, through terminals, to an external variable resistor R4; the collectors are connected to the gate terminals G1, G2. A light emitting diode LED-1 is optically coupled to photrac 26.

Operation is as follows:

Assume initially, that line voltage is rising from zero, with MT1 positive with respect to MT2. The Q11 emitter-base junction will be in the reverse biased mode. Current initially flows through the series string R1, R2, R4 and R3. The current increases as line voltage increases until it attains a level high enough to develop a voltage across R3 to overcome the emitter base threshold voltage of transistor Q12. Additional increases in line voltage, causing additional current, will flow through the emitter base junction of Q12, activating Q12, which in turn will short Gate 2 to MT2 thus prohibiting the photrac from being light triggered by Diode LED-1. The point at which Q12 is activated with respect to increasing line voltage can be set by external variable resistor R4.

It can be seen that had LED-1 triggered the photrac prior to the activation of Q12, the photrac would have latched on and remained in the conduction state for the balance of the half cycle. An adjustable window, therefore, exists between zero line voltage and the point at which the emitter-base of Q12 begins conducting. It is only within this window span that the photrac can be light triggered by LED-1.

The minimum turn-on voltage of the device is determined by the voltage drops across R1-R4 and the emitter base drop of Q12 (the latter being about 0.7v). Transistors Q11 and Q12 will only see about 10 volts, and needn't be high voltage devices.

The circuit is symmetrical, and Q11 will function as Q12, described above, on the other half of the cycle.

4. Relays

Figure 9:
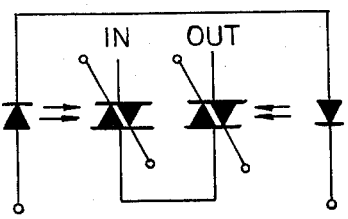
Figure 8:
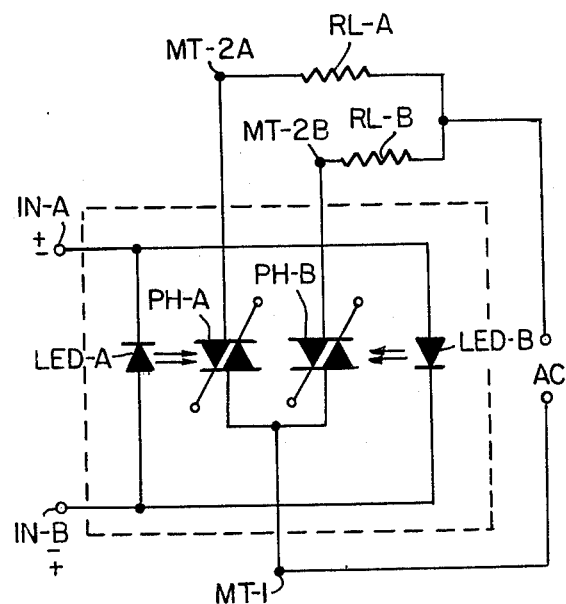

The basic concept of a photrac packaged with a LED, which effectively forms a single pole, single throw AC solid state relay, is disclosed in the hereinabove mentioned U.S. Pat. No. 3,918,083. This combination may be packaged in single or multiple units, with one LED switching one or more optically coupled photracs. Other combinations are possible, and two are illustrated in FIG. 8 and FIG. 9. In each case, a pair of LED's and a pair of photracs are used, but the FIG. 8 arrangement provides a polarized, single pole, double throw AC relay, and the FIG. 9 embodiment provides a higher voltage, single throw switch. The relays are conveniently packaged, as shown in phantom in FIG. 8, in a dual-in-line (DIP), TO header or other conventional package.

In the device illustrated in FIG. 8, LED-A is optically coupled to photrac A, and LED-B is optically coupled to photrac-B. The LED's are connected to the input so that they may be activated on opposite polarity DC. The photracs share one common main terminal MT-1 but the other main terminals MT-2A and MT-2B are distinct.

Those familiar with the optoelectronic arts will appreciate that optical coupling of these devices may be effected with suitable optically clear cements, epoxies or catalyzed silicones.

The operation of the FIG. 8 relay is as follows:

Assume IN-A is positive with respect to IN-B; LED-B will be activated, switching photrac B to conduction, and delivering current to $R_L$-B. With zero potential difference between IN-A and IN-B both LED's and thus both photracs are dormant and no current is delivered to the load resistors. When IN-B is positive with respect to IN-A LED-A is activated, triggering photrac A to conduction, and delivering current through RL-A.

By controlling the polarity of the LED inputs, the device functions in the same fashion as a two-coil, polarity sensitive, electromechanical relay.

In the configuration of FIG. 9, both LED's are activated in series, and with two photracs in series, the breakdown voltage is doubled. Typically, then BV could be double the value that would be obtained from a single photrac.

Figure 10:
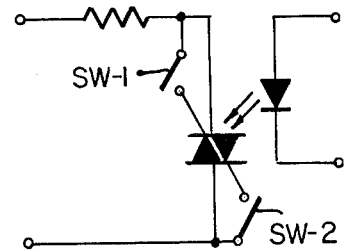

FIG. 10 illustrates circuitry whereby a photrac packaged with an LED can perform logic functions in AC circuits. It is merely a photrac connected through a load to an AC source, with two switches SW-1 and SW-2, capable, when closed, of shorting a gate terminal to a main terminal.

In FIG. 10, assume both SW-1 and SW-2 to be open. Performance of the photrac is as described in the noted patent. With only SW-1 closed, the photrac cannot be phototriggered on one half of each cycle of the sine wave. Likewise, with only SW-2 closed, the photrac cannot be phototriggered in the other half of the cycle. With both switches closed, the LED cannot trigger the photrac at all. As such, the photrac can be used as an AC logic element, delivering either half wave or full wave power to the load, by utilizing the combination of phototriggering and gate inhibiting of either or both halves of the cycle.

Various changes in the details, steps, materials and arrangements of parts, which have herein been described and illustrated to explain the nature of the invention, may be made by those skilled in the art within the principle and scope of the invention as defined in the appended claims.

What is claimed is:

1. A photrac comprising:
   a pair of transistors in common collector configuration;
   a pair of diodes connected from base to emitter of each transistor;
   an inherently-formed, lateral, third transistor of opposite conductivity type from said pair of transistors and having, as a base, the collector of said pair; and
   means for connecting the emitters of said pair of transistors across a power source.

2. The photrac as claimed in claim 1, and additionally comprising gate connection means connected to the base of at least one of said transistor pair.

3. The photrac as claimed in claim 1, wherein said transistors comprise:
   a body of semiconductive material of a first conductivity type;
   a pair of base zones of second conductivity type reaching a surface of said body and forming PN junctions therewith; and
   an emitter zone of said first conductivity type reaching said surface in each of said base zones and forming a PN junction therewith;
   said base zones forming the emitter and collector of said third transistor.

4. The photrac as claimed in claim 1, wherein said diodes are semiconductor junction diodes.

5. The photrac as claimed in claim 3, wherein the base zones of said transistor pair comprise first and second regions of second conductivity type, the second region surrounding said first region on said surface, and having an impurity concentration of from two to four orders of magnitude less than said first region, and in no event more than $10^{16}$ atoms/cc.

6. The photrac as claimed in claim 3, wherein said diodes are semiconductor junction diodes with said junction reaching a surface, and additionally comprising a dielectric isolation structure including a layer of silicon dioxide surrounding said diodes and transistors except on said surface, and a matrix having the thus-insulated transistors and diodes embedded therein.

7. A dielectrically isolated photrac comprising:
   a matrix;
   three bodies of single crystal silicon embedded in said matrix except for a major surface thereof and insulated therefrom by layers of silicon dioxide;
   a pair of transistors sharing a common collector and having all junctions reaching said surface in one said body;
   an inherently-formed, lateral, third transistor of opposite conductivity type from said pair and having, as a base, the collector of said pair;

junction diodes formed in the two other said bodies, the junction thereof reaching said surface;

means connecting each said diode across the emitter and base of one said transistor of said pair;

means for connecting the emitters of said pair of transistors across a power source; and means for connecting the bases of said transistor pair to a pair of gate terminals.

8. The photrac as claimed in claim 7, wherein the base zones of said transistor pair comprise first and second regions of second conductivity type, the second region surrounding said first region on said surface, and having an impurity concentration of from two to four orders of magnitude less than said first region, and in no event more than $10^{16}$ atoms/cc.

9. A photrac of high sensitivity comprising:
a body of single crystal silicon having a major surface;
four photodarlingtons sharing a common collector formed in said silicon and having all junctions reaching said surface, each said photodarlington including an internal emitter-base lead on said surface; and
four leads overlying said surface and insulated therefrom and connecting respective bases and emitters of adjacent pairs of said photodarlingtons.

10. A zero-crossing photrac comprising:
a photrac including a pair of main terminals connectable to an alternating current source;
a pair of gating circuits connected to the gate terminals of said photrac, each said circuit comprising a transistor having a resistor across the emitter and base, the collector connected to said gate terminal and the emitter connected to one said main terminal; and
a variable resistor connected across the bases of said transistors.

11. The photrac as claimed in claim 10, and additionally comprising a light emitting diode optically coupled to said photrac.

12. The photrac as claimed in claim 10, wherein said photrac and said gating circuits are formed in three dielectrically isolated bodies of single-crystal silicon embedded in a matrix.

13. A solid state relay comprising:
a pair of photracs sharing one common main terminal;
a pair of light-emitting diodes connected in parallel but oppositely poled, each said diode being optically coupled to one said photrac; and
means for connecting said diodes to an alternating current source.

14. A solid state relay comprising:
a pair of photracs connected in series;
a pair of light-emitting diodes connected in series;
each said diode being optically coupled to one said photrac; and
means for connecting said diodes and photracs into respective circuits.

15. A single pole, multiple throw solid state relay comprising:
a package having a light-proof cavity containing one light-emitting diode and, optically coupled thereto, a plurality of photracs;
a pair of leads connected to said diode and extending externally of said package; and
a pair of leads connected to each said photrac and extending externally of said package.

16. A power control circuit comprising:
a photrac having main terminals connectable to an alternating current source;
a light-emitting diode optically coupled to said photrac;
switch means adapted, when closed, to short one of the gate terminals of said photrac to one of said main terminals.

17. The circuit as claimed in claim 16, and additionally comprising two switch means, each connected between a gate terminal and a main terminal of said photrac.

* * * * *